United States Patent
Chiu et al.

(10) Patent No.: US 7,564,320 B2
(45) Date of Patent: Jul. 21, 2009

(54) VOLTAGE-CONTROLLED OSCILLATOR

(75) Inventors: Wei-Ming Chiu, Hsinchu (TW);
Yung-Ming Chiu, Hsinchu (TW);
Ka-Un Chan, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 21 days.

(21) Appl. No.: 11/812,032

(22) Filed: Jun. 14, 2007

(65) Prior Publication Data
US 2008/0007351 A1 Jan. 10, 2008

(30) Foreign Application Priority Data
Jun. 16, 2006 (TW) ............... 95121534 A

(51) Int. Cl.
*H03L 7/099* (2006.01)
(52) U.S. Cl. ............... 331/185; 331/117 FE; 331/186
(58) Field of Classification Search ............ 331/117 R, 331/117 FE, 167, 177 V, 185–186
See application file for complete search history.

(56) References Cited

U.S. PATENT DOCUMENTS

| 6,781,471 | B2 | 8/2004 | Huang | |
|---|---|---|---|---|
| 7,038,552 | B2* | 5/2006 | Brett et al. | 331/183 |
| 2003/0025566 | A1* | 2/2003 | Rogers | 331/109 |
| 2005/0248410 | A1 | 11/2005 | Su | |
| 2006/0103475 | A1* | 5/2006 | Hofer | 331/16 |

* cited by examiner

*Primary Examiner*—Anh Q. Tran
(74) *Attorney, Agent, or Firm*—Muncy, Geissler, Olds & Lowe, PLLC

(57) ABSTRACT

A voltage-controlled oscillator (VCO) includes: an oscillation unit, for generating an oscillation signal according to a biasing current; a current mirror, for providing the biasing current, the current mirror comprising: at least one first transistor, coupled between a first voltage level and a current source; at least one second transistor, coupled to the first voltage level, a gate of the second transistor is coupled to a gate of the first transistor and the current source; a switch module, coupled to the current mirror; and a control module, coupled to the switch module, for controlling the switch module to adjust the biasing current.

20 Claims, 6 Drawing Sheets

VOLTAGE-CONTROLLED OSCILLATOR

BACKGROUND OF THE INVENTION

1. Field of the Invention

The present invention relates to a voltage-controlled oscillator, and more particularly, to a voltage-controlled oscillator capable of controlling the biasing current such that the oscillating signal is adjusted.

2. Description of the Related Art

A voltage-controlled oscillator has become a commonly-used device in all kinds of circuits, especially in phase lock loop (PLL). The conventional voltage-controlled oscillator can be referred to U.S. Pat. No. 6,781,471, and U.S. patent applications 20030025566 and 20050248410.

However, due to the conventional voltage-controlled oscillators is hard to get a better biasing current linearity and hard to generate a desired oscillation signal with low power requirement, it is therefore providing a better voltage-controlled oscillator herein.

SUMMARY OF THE INVENTION

In view of the above-mentioned problems, an object of the invention is to provide a voltage-controlled oscillator capable of linearly adjusting the biasing current According to an embodiment of the present invention, a voltage-controlled oscillator (VCO) is disclosed. The voltage-controlled oscillator comprises: an oscillation unit, having a inductor, for generating an oscillation signal according to a biasing current; a current mirror, for providing the biasing current, the current mirror comprising: at least one first transistor, coupled between a first voltage level and a current source; at least one second transistor, coupled to the first voltage level, a gate of the second transistor is coupled to a gate of the first transistor and the current source; a switch module, coupled to the current mirror; and a control module, coupled to the switch module, for controlling the switch module to adjust the biasing current, wherein the biasing current provided into the oscillation unit is flowing from the inductor.

The present invention utilizes biasing currents to replace the prior art method of utilizing biasing voltages. Therefore, the present invention can utilize the current mirror to limit total currents which pass through the voltage-controlled oscillator. Therefore, the present invention can achieve the phase noise specification, specified by the system, by consuming lower power. In addition, because the present invention controls the number of turned-on switches such that the inputted biasing current can be controlled, the present invention can have a more linear control mechanism. In this way, the present invention can adjust the biasing current as an optimized current more accurately.

DETAILED DESCRIPTION OF THE INVENTION

The "TITLE" of the invention will be described with reference to the accompanying drawings.

Figure 1:
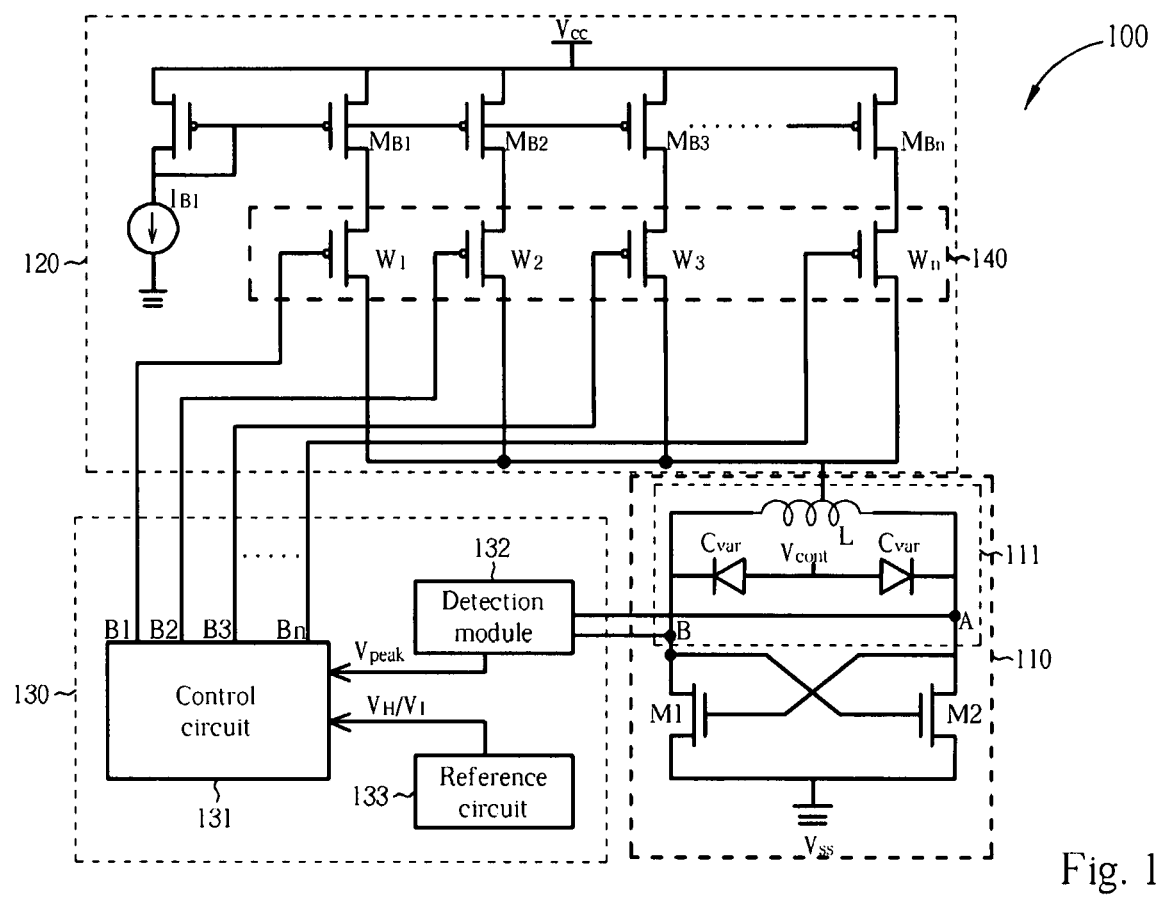
FIG. 1 shows a diagram of a voltage-controlled oscillator 100 according to the first embodiment of the present invention.

Please refer to FIG. 1, which is a diagram of a voltage-controlled oscillator 100 according to the first embodiment of the present invention. As shown in FIG. 1, the voltage-controlled oscillator 100 comprises an oscillation module 110, a current mirror circuit 120, a control module 130, and a switch module 140. The oscillation module 110 includes a LC tank 111 and cross-coupled transistors M1 and M2. The control module 130 comprises a control circuit 131, an detection module 132, and a reference circuit 133. The current mirror 120 comprises a plurality of PMOS $M_{B1}$-$M_{Bn}$. Each of the PMOS $M_{B1}$-$M_{Bn}$ is used to copy the current $IB_1$. The switch module 140 comprises a plurality of switches $W_1$-$W_n$, where each switch $W_1$-$W_n$ is coupled between a transistor $M_{B1}$-$M_{Bn}$ and the middle of the inductor of the LC tank 111.

Please note that, the LC tank 111 is utilized to generate an oscillation signal according to the biasing current. The biasing current provided into the oscillation module 110, generated by current mirror circuit 120, is flowing from the inductor L. And the transistors M1 and M2 are utilized as a negative resistor to reduce power consumption. The function and operation of the two transistors M1 and M2 are well known, and thus omitted here. And the function and operation of other components will be illustrated in the following disclosure.

As the architecture shown in FIG. 1, the amplitude of the oscillation signal generated by the LC tank 111 at node A and B cannot be too high or too low. If the amplitude is too high, the transistors M1 and M2 will be operated in saturation regions such that the phase noise will increase. On the other hand, if the amplitude is too low, the ratio of the phase power to the signal power will be raised. This also equivalently increases the phase noises. Therefore, the control module 130 can generate a control signal to the switch module 140 according to the amplitude of the oscillation signal in order to control the on/off state of each switch $W_1$-$W_n$ inside the switch module such that the biasing current can be further adjusted. That is, the control module 130 can check whether if the amplitude of the oscillation signal is too high or too low, and control the switch module 140 according to the amplitude of the oscillation signal such that the biasing current can be adjusted. Therefore, the control module 130 can maintain the amplitude of the oscillation signal in a predetermined range.

As shown in FIG. 1, the detection module 132 is coupled to the nodes A and B of the LC tank 111 for detecting the amplitude Vpeak of the oscillation signal generated by the LC tank 111. And the reference circuit 133 is utilized to generate a high reference voltage $V_H$ and a low reference voltage $V_1$. And then, the control circuit 131 can compare the amplitude Vpeak of the oscillation signal with the reference voltages $V_H/V_1$. Here, if the control circuit 131 detects that the amplitude Vpeak is higher than the high reference voltage $V_H$, this represents that the amplitude Vpeak is too high. Therefore, the control circuit 131 outputs a multi-bit digital control signal ($B_1$-$B_n$), where each bit $B_1$-$B_n$ is transferred to the above-mentioned switch $W_1$~$W_n$ to cut off an appropriate number of switches. In other words, the number of conducting switches is reduced. In this way, the biasing current outputted by the current mirror 120 is reduced such that the amplitude Vpeak of the oscillation signal generated by the current mirror 120 reduces accordingly.

On the other hand, if the control circuit 131 detects that the amplitude of the oscillation signal Vpeak is lower than the low reference voltage $V_L$. This represents that the amplitude Vpeak is too small. The control circuit 331 outputs the above-mentioned multi-bit control signals $B_1 \sim Bn$ to the above-mentioned switch $W_1 \sim W_n$ to turn on an appropriate number of switches. In other words, the number of conducting switches is raised. In this way, the biasing current outputted by the current mirror 120 is raised such that the amplitude Vpeak of the oscillation signal generated by the current mirror 120 raises accordingly. Form the above disclosure, it can be realized that the control module 130 can indeed achieve a feedback mechanism to adjust the amplitude correctly.

Figure 2:
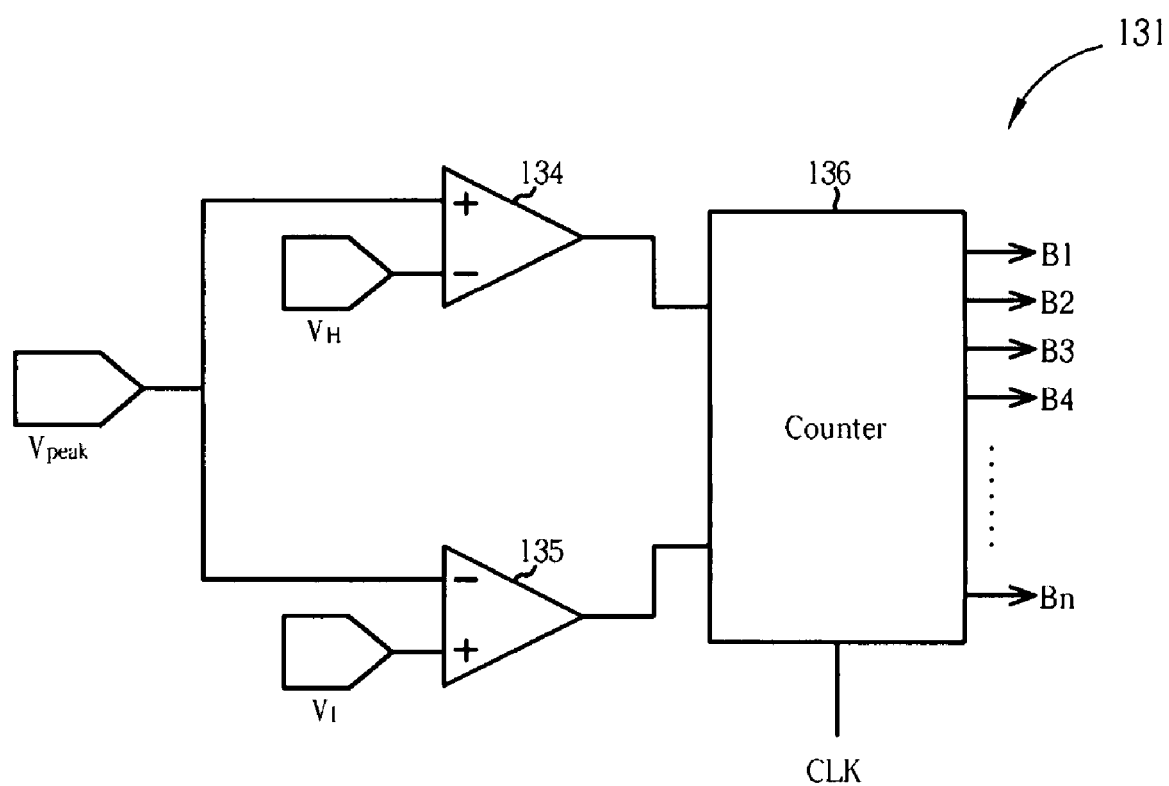
FIG. 2 shows an embodiment of control circuit 131.

Please refer to FIG. 2, which is a diagram of an embodiment of a control circuit 131 shown in FIG. 1. As shown in FIG. 2, the control circuit 131 is a digital circuit, and the control circuit 131 comprises two comparators 134 and 135, and a counter 136. The comparator 134 is utilized to compare the amplitude Vpeak of the oscillation signal with the above-mentioned high reference voltage $V_H$, and transfers the comparison result to the counter 136. And the comparator 135 is utilized to compare the amplitude Vpeak of the oscillation signal with the above-mentioned low reference voltage $V_L$, and transfers the comparison result to the counter 136. Therefore, the counter 136 can change the count value according to the comparison results of the comparators 134 and 135 and output the n-bit digital control signal $B_1$-Bn to the switches $W_1$-Wn according to the count value to achieve the above-mentioned feedback mechanism.

Please note that, in the above disclosure, the control circuit 131 compares the amplitude with a reference signal (such as the high/low reference voltages). However, this is not a limitation of the present invention. In the actual implementation, the detection circuit 132 is utilized as a feedback circuit. That is, the detection circuit 132 can be utilized to not only detect the amplitude of the oscillation signal, but also calculates the root mean square value or the average value of the oscillation signal. Therefore, the control circuit 131 can compare the reference signals with the root mean square value, the average value, or the amplitude of the oscillation signal to perform the feedback operation. This change also obeys the spirit of the present invention.

Please note that, the present invention does not limit the implementations of the control circuit 131, the detection circuit 132, and the reference circuit 133. For example, the above-mentioned high/low reference voltages can be provided by an external circuit, and are not limited to be generated by the reference circuit 133. Therefore, the reference circuit 133 is an optional device. Furthermore, the control circuit 131 shown in FIG. 2 is only regarded as an embodiment according to the present invention. In other words, all control circuits capable of achieving the above-mentioned feedback mechanism and all amplitude detecting circuit capable of detecting the amplitude of the oscillation signal belong to the scope of the present invention.

In addition, the control circuit 131 can directly be controlled by the system. For example, because the oscillation signal should be utilized by the system, the system can control the control circuit 131 according to the characteristics of the oscillation signal such that the control circuit 131 is controlled to generate the control signal for adjusting the biasing current to further adjust the oscillation signal. Surely, the above-mentioned mechanism also obeys the spirit of the present invention. In the actual implementation, the system can also store the information inside the storage device. Then, the control circuit 131 can read the information stored inside the storage device, and know whether each switch should be turning on/off according to the information. And then, the control circuit 131 can control the switch module 140 according to the information assigned by the system. For example, each switch of the switch module 140 can correspond to a register, and the system can assign the state of each switch and store the information of the state of each switch inside the register. Therefore, the control circuit 131 only has to read the data stored in the register, and generates the multi-bit control signal according to the data stored in the register such that the switches inside the switch module 140 can be controlled. This change also obeys the spirit of the present invention.

Figure 3:
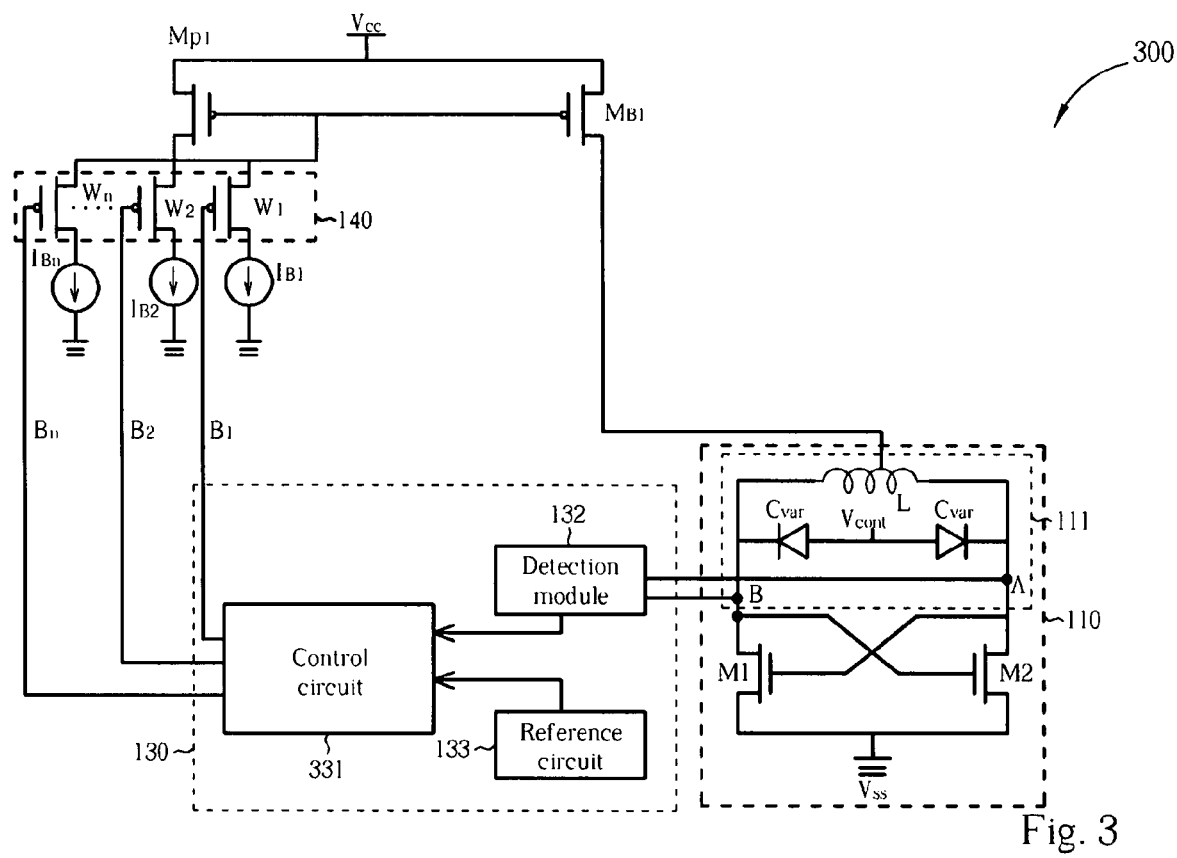
FIG. 3 shows a diagram of a voltage-controlled oscillator 300 according to the second embodiment of the present invention.

Furthermore, in addition to control the switches $W_1$-Wn of the current mirror, the present invention can utilize another mechanism to meet the demand of adjusting the biasing current. Please refer to FIG. 3, which is a diagram of a voltage-controlled oscillator 300 according to the second embodiment of the present invention. Please note that, the voltage-controlled oscillator 100 and the voltage-controlled oscillator 300 are similar. The difference between them is: the control module 330 of the voltage-controlled oscillator 300 selects at least one current source (or more current sources) by controlling the switches $W_1 \sim Wn$ as the replica current of the current mirror 320. Therefore, the control module 330 can adjust the biasing current through the above-mentioned mechanism to further adjust the amplitude of the oscillation signal.

Figure 4:
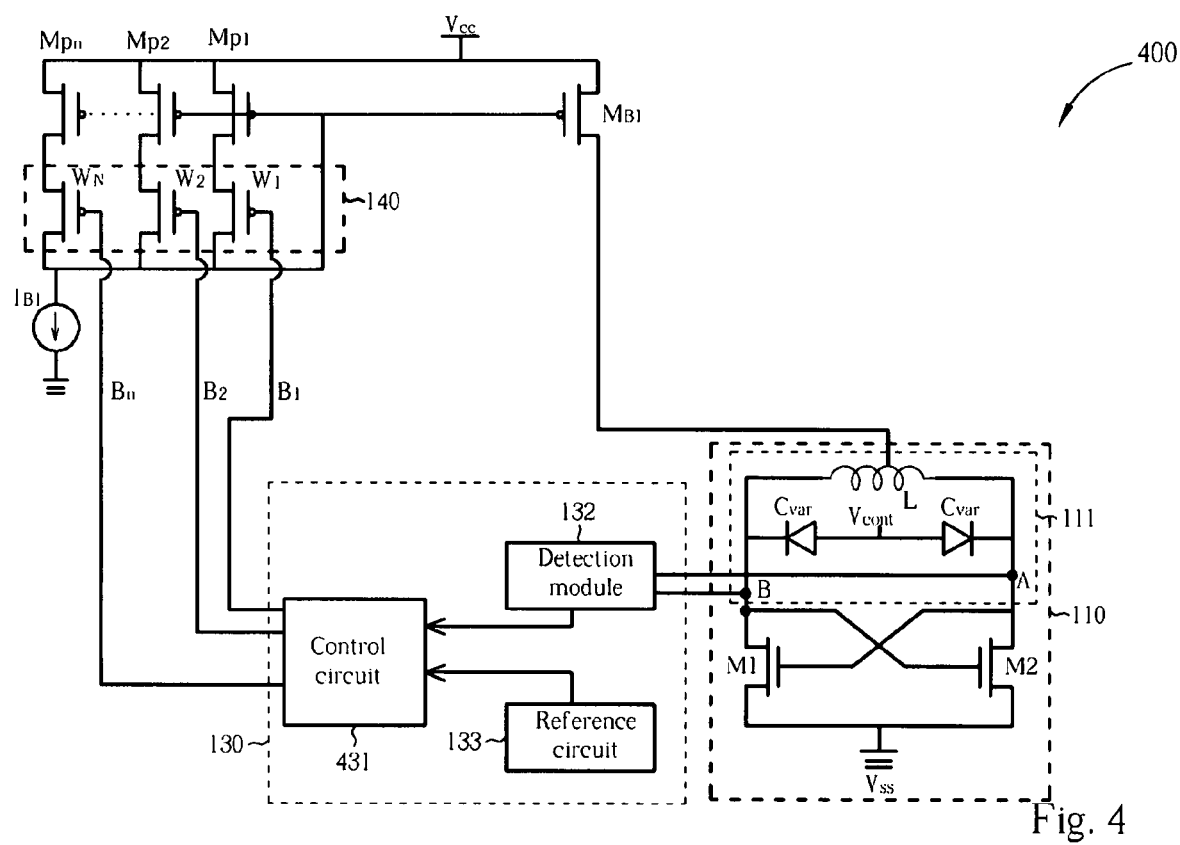
FIG. 4 shows a diagram of a voltage-controlled oscillator 400 according to the third embodiment of the present invention.

Moreover, please refer to FIG. 4, which is a diagram of a voltage-controlled oscillator 400 according to the third embodiment of the present invention. Please note that, the voltage-controlled oscillator 400 is also similar to the voltage-controlled oscillator 100. The difference between them is: the control module 430 of the voltage-controlled oscillator 400 selects at least one transistor $M_{P1}$-$M_{Pn}$ (or more transistors) to determine the replica current of the current mirror. Similarly, in this way, the control module 430 can utilize the above-mentioned mechanism to adjust the biasing current to further adjust the amplitude of the oscillation signal.

From the above disclosure, in the first embodiment, the present invention change the number of conducting transistor $M_{B1}$-$M_{Bn}$ in the current mirror 120 such that the basing current outputted from the current mirror 120 to the LC tank 111 can be adjusted. In the second embodiment, the present invention can change the number of current sources to control the replica current of the current mirror 320 such that the biasing current can be adjusted. Furthermore, in the third embodiment, the present invention can change the number of conducting transistors $M_{P1}$-$M_{Pn}$ to control the biasing current. The aforementioned three changes all obey the spirit of the present invention.

Figure 5:
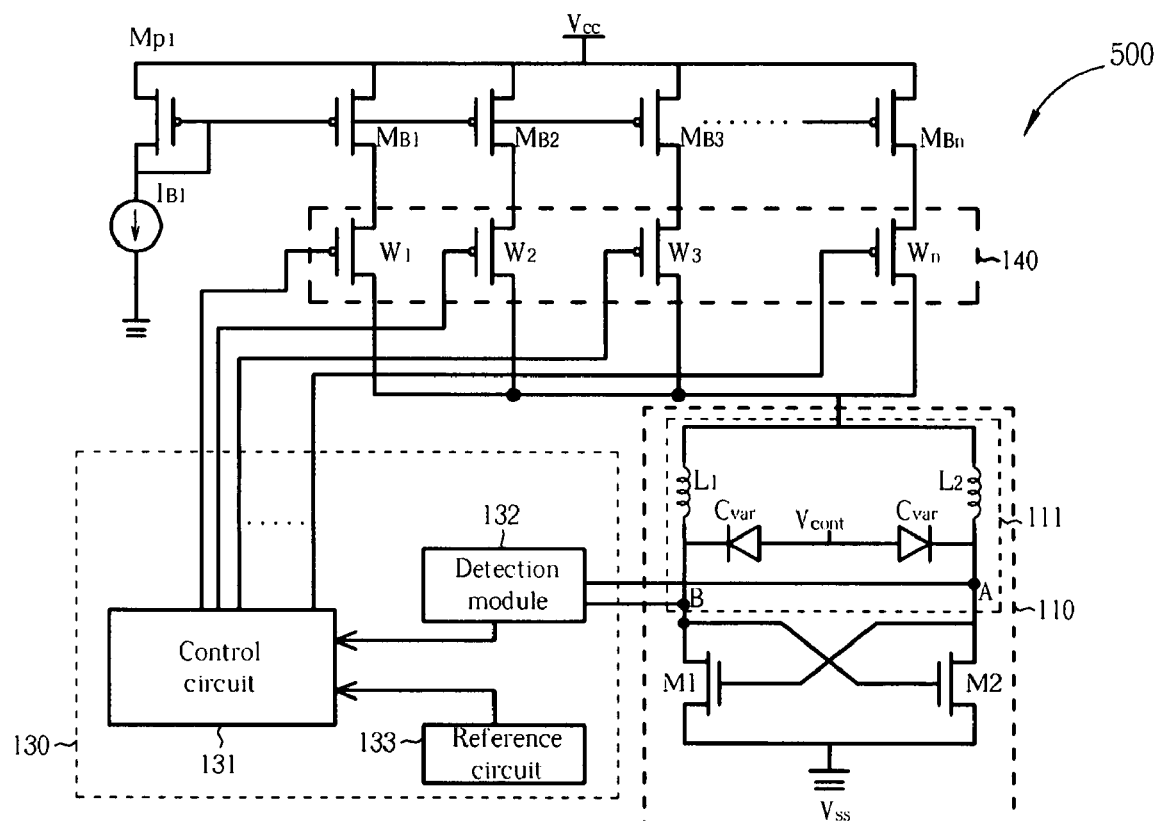
FIG. 5 shows a diagram of a voltage-controlled oscillator 500 according to the fourth embodiment of the present invention.

Please refer to FIG. 5, which is a diagram of a voltage-controlled oscillator 500 according to the fourth embodiment of the present invention. In the VCO 500, the switch module is no longer coupled to the middle of the inductor inside the LC tank 111. Instead, there are two inductors L1 and L2 inside the LC tank to equivalently replace one inductor shown in FIG. 1, FIG. 3, and FIG. 4. Related operations and functions are well known, and thus omitted here.

Figure 6:
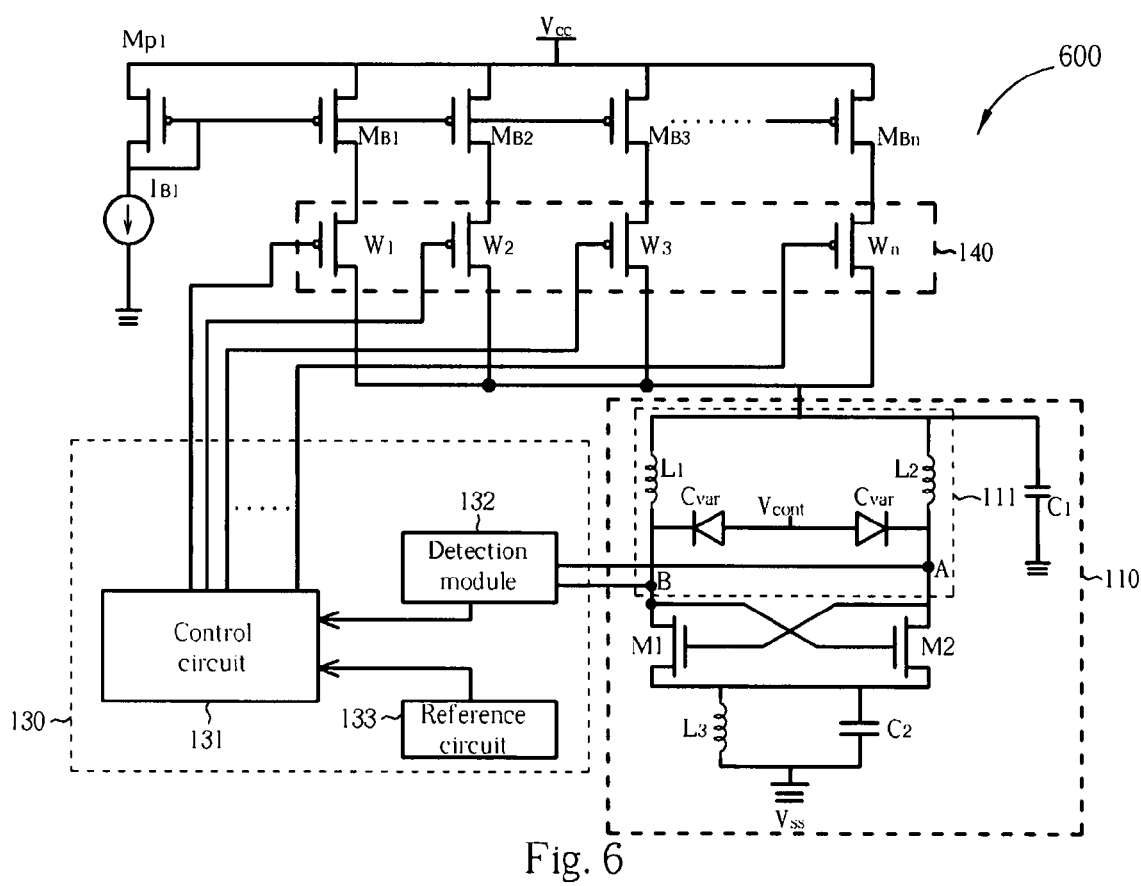
FIG. 6 shows a diagram of a voltage-controlled oscillator 600 according to the fifth embodiment of the present invention.

Please refer to FIG. 6, which is a diagram of a voltage-controlled oscillator 600 according to the fifth embodiment of the present invention. The VCO 600 is based on the VCO 300, and capacitors C1 and C2 and an inductor L3 are added in between the oscillation module and the voltage Vss. Please note that, the capacitors C1 and C2 and the inductor L3 are utilized as a filtering unit to further reduce the phase noise of the VCO 600. Related operations and functions are well known, and thus omitted here.

Please note that, because the present invention adjusts the biasing current by controlling the number of conducting switches, the present invention can have a linear control mechanism. Therefore, the present invention can more precisely adjust the biasing current to an optimized current required by the VCO.

Please note that, in the above-mentioned embodiments, the present invention does not limit the implementation of the transistors M1 and M2. For example, the transistors M1 and M2 can be NMOS, PMOS, or BJTs. This change also obeys the spirit of the present invention.

Furthermore, in the above-mentioned embodiments, the present invention does not limit the implementation of the LC tank. Besides the inductance can be implemented by only one inductor or two inductor, the capacitance can be implemented in variety of ways. For example, the capacitor can be implemented as varactor diodes. As is shown, the capacitance in the LC tank 111 can be implemented by two varactor diodes, which can change their capacitances according to the reverse voltages upon the two varactor diodes. Therefore, the capacitance of the LC tank 111 can be adjusted by a control voltage (the aforementioned reverse voltage). Moreover, the capacitor of the LC tank 111 can also be a metal-insulator-metal (MIM) capacitor. This change also obeys the spirit of the present invention.

Therefore, according to the aforementioned description, the present invention can utilize the current mirror to limit total currents which pass through the voltage-controlled oscillator. Therefore, the present invention can achieve the phase noise requirement, specified by the system, by consuming lower power. In addition, because the present invention controls the number of turned-on switches such that the inputted biasing current can be controlled, the present invention can have a more linear control mechanism. In this way, the present invention can adjust the biasing current as an optimized current more accurately.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A voltage-controlled oscillator (VCO), comprising:
    an oscillation unit, having an inductor, for generating an oscillation signal according to a biasing current;
    a current mirror, for providing the biasing current, the current mirror comprising:
        at least one first transistor, coupled between a first voltage level and a current source;
        at least one second transistor, coupled to the first voltage level, a gate of the second transistor is coupled to a gate of the first transistor and the current source;
    a switch module, coupled to the current mirror; and
    a control module, coupled to the switch module, for controlling the switch module to adjust the biasing current;
    wherein the biasing current provided into the oscillation unit is flowing from the inductor; and
    wherein the current mirror comprises a plurality of the second transistors, the switch comprises a plurality of switches, the switches are coupled between the plurality of the second transistors and the oscillation unit, and the control module controls on/off state of each of the switches to adjust the biasing current.

2. The voltage-controlled oscillator of claim 1, wherein the switch module is coupled to the middle of the inductor.

3. The voltage-controlled oscillator of claim 1, wherein the current mirror comprises a plurality of sub-current mirrors.

4. The voltage-controlled oscillator of claim 1 further comprise:
    a feedback circuit for providing a feedback signal to the control module according to the oscillation signal,
    wherein the control module controls the switch module according to the feedback signal.

5. The voltage-controlled oscillator of claim 4, wherein the control module compares the feedback signal with a reference signal to determine whether to raise or reduce the biasing current.

6. The voltage-controlled oscillator of claim 4, wherein the feedback circuit generates the feedback signal according to a root mean square value, an average value, or an amplitude of the oscillation signal.

7. The voltage-controlled oscillator of claim 1, wherein the oscillation unit comprises:
    an LC tank, comprising a capacitor module and the inductor; and
    cross-coupled third transistor and fourth transistor, coupled to the LC tank;
    wherein the third transistor and the fourth transistor are coupled between a second reference voltage and the inductor, and the second reference voltage is different from the first reference voltage.

8. The voltage-controlled oscillator of claim 7, wherein the capacitor module comprises a metal-insulator-metal (MIM) capacitor.

9. The voltage-controlled oscillator of claim 7, wherein the capacitor module comprises a first varactor diode and a second varactor diode, the first and the second varactor diodes both comprises a cathode end and an anode end, and the anode ends of the first and the second varactor diodes are both coupled to a control voltage to adjust an capacitance of the capacitor module.

10. The voltage-controlled oscillator of claim 7, wherein the oscillation unit comprises a filtering unit, coupled between the second reference voltage and the cross-coupled third and fourth transistors.

11. The voltage-controlled oscillator of claim 1, further comprising a storage unit, wherein the control module controls the switch module according to data stored inside the storage unit.

12. A voltage-controlled oscillator (VCO), comprising:
    a biasing current outputting unit, for providing a biasing current;
    an oscillation unit, having an inductor, for generating an oscillation signal according to the biasing current;
    a switch module, coupled between the biasing current outputting unit and the oscillation unit, for adjusting the biasing current to oscillation unit the according to a feedback signal; and
    a feedback control module, coupled between the oscillation unit and the switch module, for generating the feedback signal to the switch module according the oscillation signal;
    wherein the biasing current provided into the oscillation unit is flowing from the inductor.

13. The voltage-controlled oscillator of claim 12, wherein the biasing current outputting unit is a current mirror.

14. The voltage-controlled oscillator of claim 12, wherein the feedback control module comprise:
    a detector, for detecting the oscillation signal to generate a first voltage signal;

a reference voltage generator, for generating a first reference voltage; and a control unit, for comparing the first voltage signal and the first reference voltage to generate the feedback signal.

15. The voltage-controlled oscillator of claim 12, wherein the biasing current outputting unit is a current mirror.

16. A voltage-controlled oscillator (VCO), comprising:
an oscillation unit, having an inductor, for generating an oscillation signal according to a biasing current;
a current mirror, for providing the biasing current, the current mirror comprising:
at least one first transistor, coupled between a first voltage level and a current source;
at least one second transistor, coupled to the first voltage level, a gate of the second transistor is coupled to a gate of the first transistor and the current source;
a switch module, coupled to the current mirror; and
a control module, coupled to the switch module, for controlling the switch module to adjust the biasing current;
wherein the biasing current provided into the oscillation unit is flowing from the inductor; and
wherein the switch module comprises a plurality of switches, the switches are coupled between the first transistor and the current source, and the control module controls on/off state of each of the switches to adjust the biasing current.

17. The voltage-controlled oscillator of claim 16, wherein the current mirror comprises a plurality of the first transistors, the switches are coupled between the plurality of the first transistors and the current source, and the control module controls on/off state of each of the switches to adjust the biasing current.

18. The voltage-controlled oscillator of claim 17, wherein the current mirror comprises a plurality of sub-current mirrors.

19. The voltage-controlled oscillator of claim 16, wherein the switches are coupled between the first transistor and the sub-current mirrors, and the control module controls the on/off state of each of the switches to adjust the biasing current.

20. The voltage-controlled oscillator of claim 16 further comprise:
a feedback circuit for providing a feedback signal to the control module according to the oscillation signal,
wherein the control module controls the switch module according to the feedback signal.

* * * * *